(12) United States Patent
Xu

(10) Patent No.: US 11,721,974 B2
(45) Date of Patent: Aug. 8, 2023

(54) ELECTROSTATIC DISCHARGE (ESD) PROTECTION CIRCUIT AND CHIP

(71) Applicant: CHANGXIN MEMORY TECHNOLOGIES, INC., Hefei (CN)

(72) Inventor: Qian Xu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 87 days.

(21) Appl. No.: 17/412,178

(22) Filed: Aug. 25, 2021

(65) Prior Publication Data

US 2022/0216693 A1 Jul. 7, 2022

Related U.S. Application Data

(63) Continuation of application No. PCT/CN2021/103520, filed on Jun. 30, 2021.

(30) Foreign Application Priority Data

Jan. 4, 2021 (CN) .......................... 202110004426.4

(51) Int. Cl.
H02H 9/04 (2006.01)
(52) U.S. Cl.
CPC .................................. H02H 9/046 (2013.01)
(58) Field of Classification Search
CPC ............................ H02H 9/046; H01L 27/0262
USPC .......................................................... 361/56
See application file for complete search history.

(56) References Cited

U.S. PATENT DOCUMENTS

| | | | |
|---|---|---|---|
| 6,671,153 B1 | 12/2003 | Ker et al. | |
| 9,373,612 B1* | 6/2016 | Huang | H01L 27/0288 |
| 11,159,014 B2* | 10/2021 | Ilie | H02H 9/046 |
| 11,495,955 B2* | 11/2022 | Bogi | H01L 27/0262 |
| 2005/0231866 A1* | 10/2005 | Mergens | H03K 17/08122 |
| | | | 361/56 |
| 2009/0268359 A1* | 10/2009 | Chatty | H02H 9/046 |
| | | | 361/56 |
| 2010/0027173 A1* | 2/2010 | Wijmeersch | H02H 9/046 |
| | | | 361/56 |
| 2010/0172059 A1* | 7/2010 | Chaine | H02H 9/046 |
| | | | 361/56 |
| 2011/0063764 A1 | 3/2011 | Barrow | |

(Continued)

FOREIGN PATENT DOCUMENTS

| | | |
|---|---|---|
| CN | 104332981 A | 2/2015 |
| CN | 205231059 U | 5/2016 |

(Continued)

*Primary Examiner* — Dharti H Patel
(74) *Attorney, Agent, or Firm* — Kilpatrick Townsend & Stockton LLP

(57) ABSTRACT

Embodiments relate to an electrostatic discharge (ESD) protection circuit and a chip. The ESD protection circuit includes: an ESD protection module, arranged inside a protected chip and connected to a protected circuit; and a control module, connected to the ESD protection module and configured to output a low-level signal to the ESD protection module to trigger the ESD protection module to discharge an electrostatic current when an ESD event occurs in the protected chip, and output a high-level signal to the ESD protection module to reduce a static leakage current of the ESD protection module when the ESD event does not occur in the protected chip.

14 Claims, 3 Drawing Sheets

(56) References Cited

U.S. PATENT DOCUMENTS

| | | | |
|---|---|---|---|
| 2011/0149449 A1* | 6/2011 | Lin | H01L 27/0262 |
| | | | 361/56 |
| 2011/0286135 A1* | 11/2011 | Campi, Jr. | H01L 27/0262 |
| | | | 257/E29.166 |
| 2012/0120531 A1* | 5/2012 | Abou-Khalil | H02H 9/046 |
| | | | 361/56 |
| 2012/0257317 A1* | 10/2012 | Abou-Khalil | H01L 27/0262 |
| | | | 716/101 |
| 2013/0114170 A1* | 5/2013 | Chen | H02H 9/046 |
| | | | 361/56 |
| 2013/0234199 A1 | 9/2013 | Liang et al. | |
| 2015/0124360 A1* | 5/2015 | Jack | H02H 9/04 |
| | | | 361/679.21 |
| 2022/0216693 A1* | 7/2022 | Xu | H01L 27/0262 |

FOREIGN PATENT DOCUMENTS

| | | | |
|---|---|---|---|
| CN | 106920792 A | * | 7/2017 |
| CN | 110867482 A | | 3/2020 |
| CN | 211238251 U | | 8/2020 |
| CN | 113921516 A | * | 1/2022 |

* cited by examiner

ELECTROSTATIC DISCHARGE (ESD) PROTECTION CIRCUIT AND CHIP

This application is a continuation of PCT/CN2021/103520, filed on Jun. 30, 2021, which claims the priority to the Chinese patent application No. 202110004426.4 filed on Jan. 4, 2021, and titled "ELECTROSTATIC DISCHARGE (ESD) PROTECTION CIRCUIT AND CHIP", which is incorporated herein by reference in its entirety.

TECHNICAL FIELD

This application relates to the field of integrated circuit technology, and more particularly, to an electrostatic discharge (ESD) protection circuit and a chip.

BACKGROUND

Currently, semiconductor manufacturing processes are becoming more and more advanced. With increasingly shorter channel length, increasingly shallower junction depth, the application of metal silicide, the application of a lightly doped drain (LDD), and an increasingly thinner oxide layer, an electro-static discharge (ESD) has a smaller and smaller design window, and ESD protection design faces a bigger challenge. In order to protect an integrated circuit from being damaged by static electricity, the integrated circuit is usually protected when the ESD event occurs. However, the traditional ESD protection circuit has problems such as leakage.

SUMMARY

In a first aspect, the present disclosure provides an ESD protection circuit, including:

an ESD protection module, arranged inside a protected chip and connected to a protected circuit; and a control module, connected to the ESD protection module and configured to output a low-level signal to the ESD protection module to trigger the ESD protection module to discharge an electrostatic current when an ESD event occurs in the protected chip, and output a high-level signal to the ESD protection module to reduce a static leakage current of the ESD protection module when the ESD event does not occur in the protected chip.

In another aspect, the present disclosure provides a chip, including a protected circuit and the ESD protection circuit described above.

The details of the various embodiments of the present disclosure are illustrated in the following drawings and description. Based on the specification, drawings, and claims, those skilled in the art easily understand other features, problems to be solved, and beneficial effects of the present disclosure.

BRIEF DESCRIPTION OF THE DIAGRAMS

In order to better describe and illustrate the embodiments of this application, one or more drawings can be referred to. However, the additional details or examples used to describe the drawings should not be considered as limitation to the scope of any one of the invention creation, the presently described embodiments, and manners of this application.

DESCRIPTION OF THE INVENTION

Figure 1:
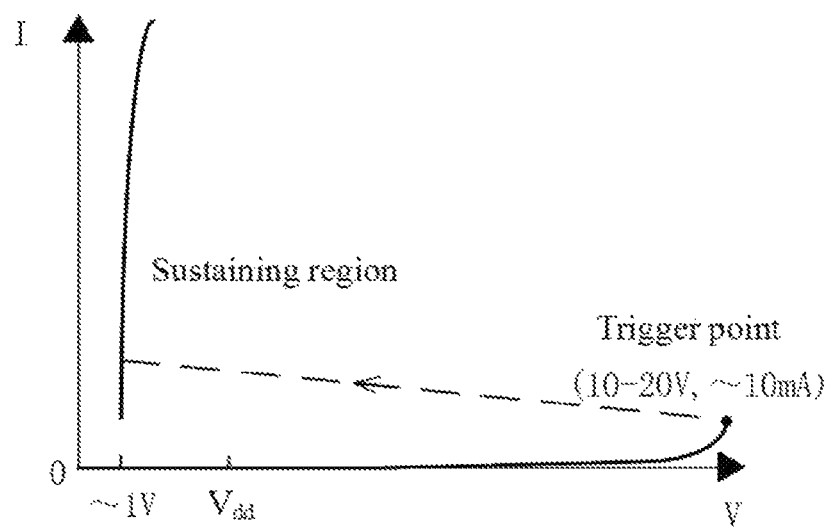
FIG. 1 is a voltage-current feature diagram of an SCR in an ESD device.

In order to facilitate the understanding of this application, the following makes a more comprehensive description of this application with reference to the relevant drawings. The embodiments of this application are shown in the drawings. However, this application can be implemented in many different forms and is not limited to the embodiments described herein. On the contrary, an objective of providing these embodiments is to make the understanding of the disclosure of this application more thorough and comprehensive.

Unless otherwise specified, all technical and scientific terms used herein have the same meaning as commonly understood by the person skilled in the art to which this application belongs. The terms used in the description of this application herein are only for the objective of describing specific embodiments, and are not intended to limit this application.

It can be understood that the terms "first", "second", etc. used in this application can be used herein to describe various elements, but these elements are not limited by these terms. These terms are only used to distinguish one element from another element.

It can be understood that "connection" in the following embodiments should be understood as "electrical connection", "communication connection" and the like if a connected circuit, a module, a unit, etc. have electrical signal or data transmission between each other.

For example, as used herein, the singular form "a", "an" and "the" may also include plural forms, unless the context clearly indicates otherwise. It should also be understood that the terms "comprising/including" or "having" and the like designate the existence of the stated features, wholes, steps, operations, assemblies, parts or combinations thereof, but do not exclude the possibility of the existence or addition of one or more other features, wholes, steps, operations, assemblies, parts or combinations thereof.

Figure 2:
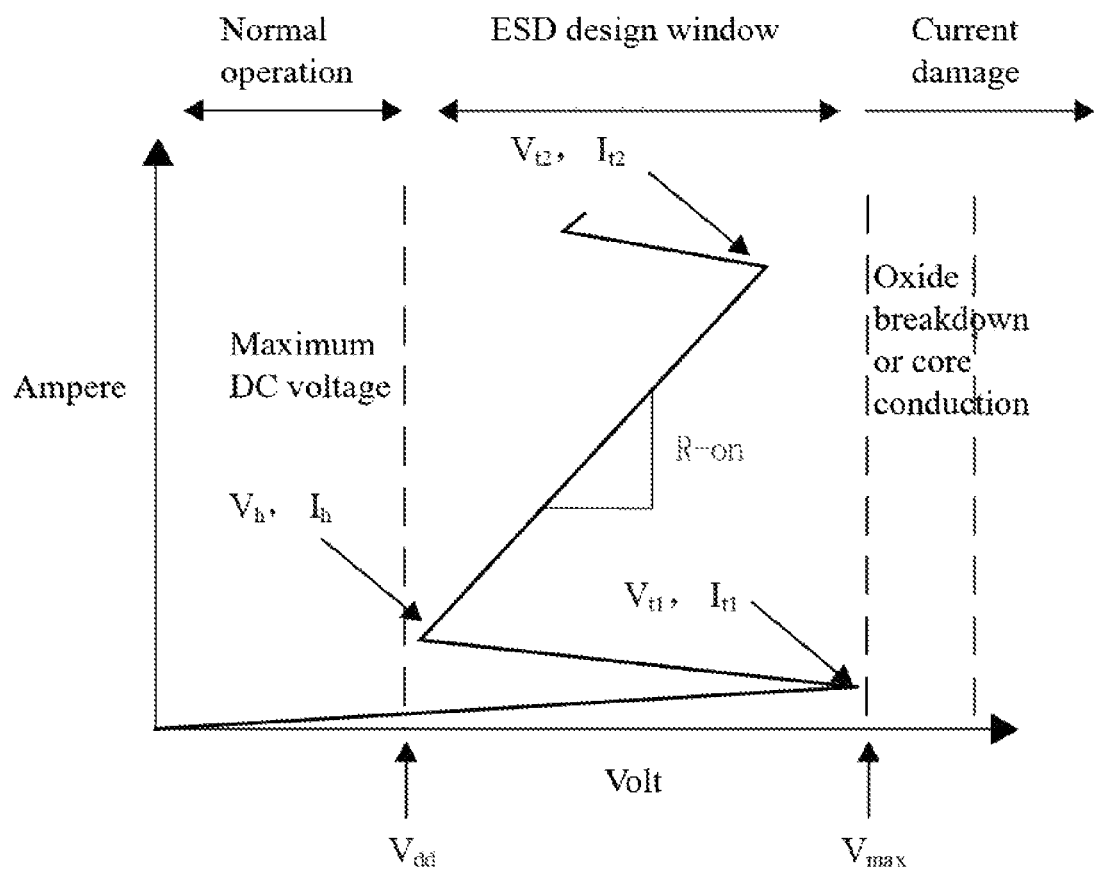
FIG. 2 is a design window diagram of an ESD.
Figure 3:
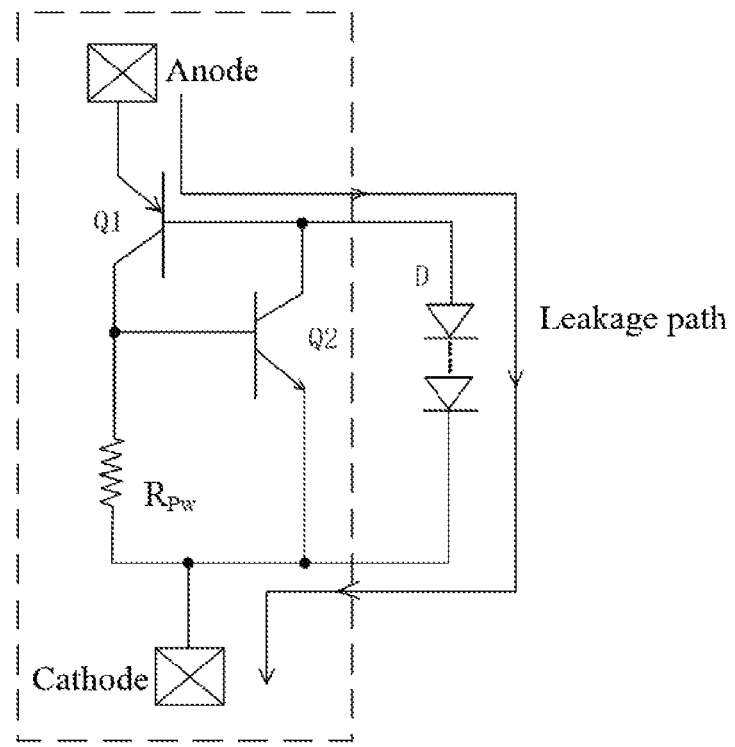
FIG. 3 is an equivalent circuit diagram of a DTSCR.

At present, an ESD device used when an integrated circuit is when the ESD event occurs protected usually include a diode, a metal-oxide-semiconductor field-effect transistor (MOS), and a silicon controlled rectifier (SCR). However, the conventional SCR has a high trigger voltage and a low holding voltage, and is prone to latch-up, which is not suitable for ESD protection of a dynamic random access memory (DRAM) product. A voltage-current feature of the conventional SCR is shown in FIG. 1, and a design window for which the SCR is deviated from the ESD is shown in FIG. 2. In order to apply the SCR to the ESD protection of the DRAM product, the SCR is replaced with a diode string-triggered silicon controlled rectifier (DTSCR) in the traditional art. A diagram of an equivalent circuit of the DTSCR is shown in FIG. 3. The equivalent circuit includes a diode string D and a conventional SCR (a circuit diagram in a dashed line box is the diagram of the equivalent circuit of the SCR). However, the DTSCR has a leakage problem in a branch of the diode string D. and a leakage path is shown in the direction of an arrow in FIG. 3.

Figure 4:
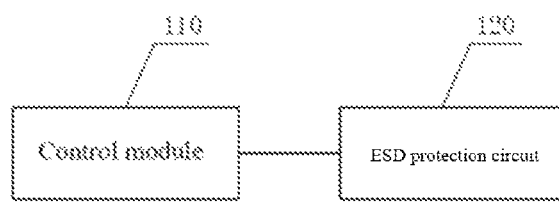
FIG. 4 is a structural block diagram of an ESD protection circuit according to an embodiment of this application.

Referring to FIG. 4, FIG. 4 is a structural block diagram of an ESD protection circuit according to an embodiment of this application. The ESD protection circuit includes a control module 110 and an ESD protection module 120. The ESD protection module 120 is arranged inside a protected chip (not shown in FIG. 1), and connected to a protected circuit (not shown in FIG. 1). The control module 110 is connected to the ESD protection module 120 and configured to output a low-level signal to the ESD protection module 120 to trigger the ESD protection module 120 to discharge an electrostatic current when an ESD event occurs in the protected chip, and output a high-level signal to the ESD protection module 120 to reduce a static leakage current of the ESD protection module 120 when the ESD event does not occur in the protected chip.

In some embodiments, the protected chip may be a logic chip, an analog chip, a memory chip, etc. When the protected chip is a memory chip, the protected chip may be a DRAM chip. The protected circuit may be a functional circuit inside the protected chip. The ESD protection module 120 is arranged inside the protected chip, and connected to the protected circuit. The control module 110 is connected to the ESD protection module 120. The control module 110 is configured to detect whether an ESD event occurs in the protected chip. When the ESD event occurs in the protected chip, the control module 110 outputs a low-level signal to the ESD protection module 120 as a trigger signal to trigger the ESD protection module 120 to discharge the electrostatic current, thereby when the ESD event occurs protecting the protected chip. The control module 110 may be connected to a branch circuit with a static leakage current in the ESD protection module 120. The control module 110 outputs a high-level signal to the branch circuit with the static leakage current in the ESD protection module 120 when the control module 110 does not detect that the ESD event occurs in the protected chip, so that when the ESD event does not occur in the protected chip, a voltage drop across the branch circuit with the static leakage current can be reduced, thereby reducing a static leakage current generated by the ESD protection module 120. The ESD protection circuit in this embodiment can not only when the ESD event occurs protect the protected chip, but also reduce a leakage current thereof.

Figure 5:
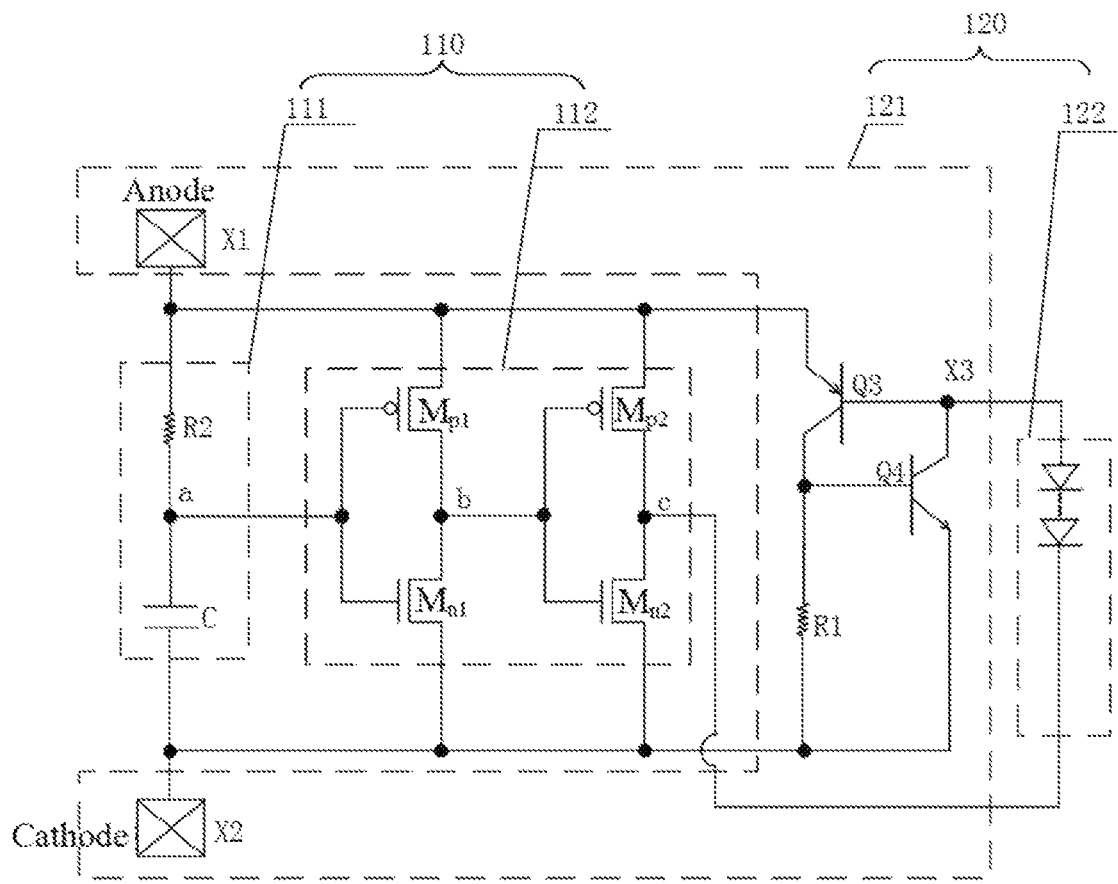
FIG. 5 is an equivalent circuit diagram of an ESD protection circuit according to an embodiment of this application.

In an embodiment, referring to FIG. 5, the ESD protection module 120 includes a silicon controlled rectifier 121 and a diode string 122. The silicon controlled rectifier 121 has an anode X1, a cathode X2, and a trigger terminal X3. The control module 110 is connected between the anode X1 and the cathode X2 of the silicon controlled rectifier 121. The silicon controlled rectifier 121 can be any silicon controlled rectifier known to those skilled in the art or an improved device thereof.

The diode string 122 includes a plurality of diodes connected in series, which are connected end to end in turn. A cathode and an anode derived from two diodes at a head end and a tail end are used as a cathode and an anode of the diode string 122, respectively. The number of diodes can be set according to requirements. The anode of the diode string 122 is connected to the trigger terminal X3 of the silicon controlled rectifier 121, and the cathode thereof is connected to the control module 110. When the ESD event occurs in the protected chip, the control module 110 outputs a low-level signal to the cathode of the diode string 122 as a trigger signal, and the silicon controlled rectifier 121 is triggered to work through the diode string 122, thereby discharging the electrostatic current generated when the ESD event occurs in the protected chip. In some embodiments, when the ESD event occurs in the protected chip, a voltage difference between two ends of the diode string 122 is greater than a threshold voltage at which the diode string 122 is conducted. The diode string 122 is conducted first, and then triggers the silicon controlled rectifier 121. A high current is quickly passed through the silicon controlled rectifier 121, thereby discharging static electricity. Since a break-over voltage required for the diode string 122 to be conducted first is relatively low, the ESD protection module 120 has a relatively small trigger voltage. When the ESD event does not occur in the protected chip, the control module 110 outputs a high-level signal to the cathode of the diode string 122, which greatly reduces a voltage drop across the diode string 122, thereby reducing a leakage current of a branch circuit in which the diode string 122 is arranged.

In this embodiment, the protected chip is when the ESD event occurs protected by the DTSCR, so that the silicon controlled rectifier 121 in the ESD protection circuit has the advantages of a low trigger voltage, an adjustable trigger voltage, and a holding voltage greater than a power supply voltage of the protected chip. Therefore, the occurrence of latch-up is avoided, and ESD protection capability is improved. The silicon controlled rectifier 121 is especially suitable for ESD protection of a chip with a low working voltage in an advanced manufacturing process. The protected chip may be a DRAM chip. In addition, by improving the traditional DTSCR, when the ESD event does not occur in the protected chip, the control module 110 outputs a high-level signal to the cathode of the diode string 122 in the DTSCR to reduce the voltage drop across the diode string 122, thereby reducing a leakage current of the DTSCR.

In an embodiment, the trigger voltage of the silicon controlled rectifier 121 increases as the number of diodes increases. The trigger voltage can be adjusted according to an operating voltage of the protected chip. The trigger voltage of the silicon controlled rectifier 121 is proportional to the number of diodes. Therefore, the number of diodes in the diode string 122 can be set according to the operating voltage of the protected chip. When the protected chip is a DRAM chip, the operating voltage of the protected chip can be 1.1V or 1.2V. The number of diodes can be set in the range of 2 to 3 according to the operating voltage of the protected chip, so as to meet the requirements of the DRAM chip. Of course, in order to meet requirements of operating voltages of other chips, the number of diodes in the diode string 122 can also be set to other values according to actual needs.

In an embodiment, the trigger voltage of the silicon controlled rectifier 121 is less than a maximum voltage of an ESD design window. Referring to FIG. 2, a maximum value $V_{max}$ of the ESD design window can be set according to the operating voltage of the protected chip. Then the trigger voltage $V_{t1}$ of the silicon controlled rectifier 121 can be set to be less than the maximum value $V_{max}$ of the ESD design window. A trigger point ($V_{t1}$, $I_{t1}$) of the silicon controlled rectifier 121 is within the ESD design window.

In an embodiment, the holding voltage of the silicon controlled rectifier 121 is greater than the power supply voltage of the protected chip. Still referring to FIG. 2, a minimum value of the ESD design window can be set as the power supply voltage $V_{dd}$ of the protected chip. The holding voltage $V_h$ of the silicon controlled rectifier 121 is set to be greater than the power supply voltage $V_{dd}$ of the protected chip, so that a holding point ($V_h$, $I_h$) of the silicon controlled rectifier can be in the ESD design window. The holding voltage of the silicon controlled rectifier 121 is greater than the power supply voltage of the protected chip to avoid the occurrence of latch-up.

In an embodiment, referring to FIG. 5, an equivalent circuit of the silicon controlled rectifier 121 includes a first triode Q3, a second triode Q4, and a first resistor R1. An emitter of the first triode Q3 is the anode X1 of the silicon controlled rectifier 121. A base of the first triode Q3 is connected to the anode of the diode string 122 and a collector of the second triode Q4. A collector of the first triode Q3 is connected to a base of the second triode Q4 and one end of the first resistor R1, and an emitter of the second triode Q4 is connected to the other end of the first resistor R1 to serve as the cathode of the silicon controlled rectifier 121. In this embodiment, the base of the first triode Q3 is connected to the collector of the second triode Q4 to serve as the trigger terminal X3 of the silicon controlled rectifier 121.

In some embodiments, the first triode Q3 is a PNP triode, and the second triode Q4 is an NPN triode.

In this embodiment, when the ESD event occurs in the protected chip, the control module 110 outputs a low-level signal to the cathode of the diode string 122, so that the diode string 122 is conducted first, and then triggers the first triode Q3 and the second triode Q4 in the silicon controlled rectifier 121 to be conducted sequentially, thereby forming a plurality of electrostatic discharge channels to discharge the electrostatic current generated by the protected chip. In some embodiments, when the ESD event occurs in the protected chip, the voltage difference between the two ends of the diode string 122 is greater than the threshold voltage at which the diode string 122 is conducted. The diode string 122 is conducted first, and then triggers the first triode Q3 and the second triode Q4 in the silicon controlled rectifier 121 to be conducted sequentially. A high current is quickly passed through the silicon controlled rectifier 121, thereby discharging static electricity. Since the break-over voltage required for the diode string 122 to be conducted first is relatively low, the ESD protection module 120 has a relatively small trigger voltage.

In an embodiment, still referring to FIG. 5, the control module 110 includes a trigger unit 111 and a buffer unit 112. The trigger unit 111 is connected between the anode X1 and the cathode X2 of the silicon controlled rectifier 121, and is configured to generate a low-level signal when the ESD event occurs in the protected chip, and generate a high-level signal when the ESD event does not occur in the protected chip. The buffer unit 112 is connected between the anode X1 and the cathode X2 of the silicon controlled rectifier 121. An input terminal of the buffer unit 112 is connected to an output terminal of the trigger unit 111. An output terminal of the buffer unit 112 is connected to the cathode of the diode string 122. The buffer unit 112 is configured to reverse a high-level signal or low-level signal generated by the trigger unit 111 by even times and output the high-level signal or low-level signal to the diode string 122. For example, the buffer unit 112 can reverse the high-level signal or low-level signal generated by the trigger unit twice and then output the high-level signal or low-level signal to the diode string 122.

In some embodiments, the trigger unit 111 generates a low-level signal when the ESD event occurs in the protected chip. After the input terminal of the buffer unit 112 receives the low-level signal output by the trigger unit 111, the input terminal of the buffer unit 112 reverses the low-level signal by even times, and still outputs a low-level signal to the diode string 122. In some embodiments, the trigger unit 111 generates a high-level signal when the ESD event does not occur in the protected chip. After the input terminal of the buffer unit 112 receives the high-level signal output by the trigger unit 111, the input terminal of the buffer unit 112 reverses the high-level signal by even times, and still outputs a high-level signal to the diode string 122.

Of course, in other embodiments, if conditions permit, a voltage value of the low-level signal obtained through conversion by the buffer unit 112 can be set to be equal to a voltage value of the low-level signal generated by the trigger unit 111, and a voltage value of the high-level signal obtained through conversion by the buffer unit 112 is equal to a voltage value of the high-level signal generated by the trigger unit 111.

In an embodiment, the trigger unit 111 includes a second resistor R2 and a capacitor C. One end of the second resistor R2 is connected to the anode X1 of the silicon controlled rectifier 121, and the other end thereof is connected to one end of the capacitor C and serves as the output terminal of the trigger unit 111. The other end of the capacitor C is connected to the cathode X2 of the silicon controlled rectifier 121.

In this embodiment, the trigger unit 111 is an RC circuit for detecting whether the ESD event occurs in the protected chip. When the ESD event occurs in the protected chip, a transient current flows through the RC circuit, so that the capacitor C is conducted, which is equivalent to a short circuit. Therefore, a potential of the output terminal of the trigger unit 111 is set as the same potential as the cathode X2 of the silicon controlled rectifier 121. When the ESD event does not occur in the protected chip, the capacitor C in the RC circuit is not conducted, which is equivalent to a disconnection. The second resistor R2 sets the potential of the output terminal of the trigger unit 111 as the same potential as the anode X1 of the silicon controlled rectifier 121.

In an embodiment, the buffer unit 112 includes a first PMOS transistor $M_{p1}$, a second PMOS transistor $M_{p2}$, a first NMOS transistor $M_{n1}$, and a second NMOS transistor $M_{n2}$. A source of the first PMOS transistor $M_{p1}$ and a source of the second PMOS transistor $M_{p2}$ are both connected to the anode X1 of the silicon controlled rectifier 121. A source of the first NMOS transistor $M_{n1}$ and a source of the second NMOS transistor $M_{n2}$ are both connected to the cathode X2 of the silicon controlled rectifier 121. A gate of the first PMOS transistor $M_{p1}$ and a gate of the first NMOS transistor $M_{n1}$ are both connected to the output terminal of the trigger unit 111. A drain of the first PMOS transistor $M_{p1}$ and a drain of the first NMOS transistor $M_{n1}$ are both connected to a gate of the second PMOS transistor $M_{p2}$ and a gate of the second NMOS transistor $M_{n2}$. A drain of the second PMOS transistor $M_{p2}$ and a drain of the second NMOS transistor $M_{n2}$ are both connected to the cathode of the diode string 122.

In this embodiment, when the ESD event occurs in the protected chip, the trigger unit 111 outputs a low-level signal to the input terminal of the buffer unit 112. In FIG. 5, a point a is at a low-level signal, so that the first PMOS transistor $M_{p1}$ is conducted while the first PMOS transistor $M_{p1}$ is disconnected. A point b is at a high-level signal, so that the second NMOS transistor $M_{n2}$ is conducted while the second PMOS transistor $M_{p2}$ is disconnected. A point c is at a low-level signal, that is, the buffer unit 112 outputs a low-level signal to the cathode of the diode string 122. The diode string 122 conducts forward and hence triggers the silicon controlled rectifier 121 to discharge the electrostatic current. When the ESD event does not occur in the protected chip, the trigger unit 111 outputs a high-level signal to the input terminal of the buffer unit 112. In FIG. 5, the point a is at a high-level signal, so that the first NMOS transistor $M_{n1}$ is conducted while the first PMOS transistor $M_{p1}$ is disconnected. The point b is at a low-level signal, so that the second PMOS transistor $M_{p2}$ is conducted w % bile the second NMOS transistor $M_{n2}$ is disconnected. The point c is at a high-level signal, that is, the buffer unit 112 outputs a high-level signal to the cathode of the diode string 122, thereby reducing the voltage drop across the diode string 122 and causing the diode string 122 to be cut off, and greatly reducing a leakage current.

This application also provides a chip. The chip includes a protected circuit and the ESD protection circuit in any of the above embodiments. The ESD protection circuit can discharge an electrostatic current when the ESD event occurs in the chip, to ensure that the protected circuit is not damaged. A static leakage current of the ESD protection circuit itself is small or even zero, and therefore a normal function of the protected circuit is not affected and the loss of the chip is not increased when the ESD event does not occur in the chip.

In an embodiment, the protected circuit includes a power terminal (VDD), a ground terminal (VSS), and a signal transmission terminal. The ESD protection circuit is connected between any two of the power terminal, the ground terminal, and the signal transmission terminal to protect the protected circuit when the ESD event occurs. The signal transmission terminal of the protected circuit can include an input terminal and an output terminal.

Figure 6:
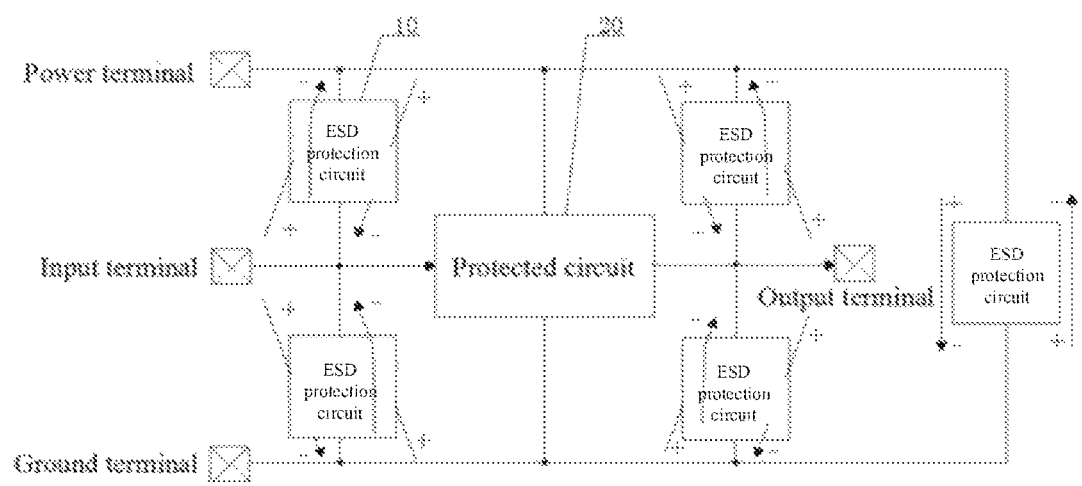
FIG. 6 is a structural block diagram of a chip according to an embodiment of this application.

In an embodiment, referring to FIG. 6, the chip includes a plurality of ESD protection circuits 10. The ESD protection circuit 10 is connected between a power terminal and a ground terminal, between the power terminal and a signal transmission terminal, and between the ground terminal and the signal transmission terminal of a protected circuit 20. The ESD protection circuit 10 can be connected between the power terminal and the input terminal, between the input terminal and the ground terminal, between the power terminal and the output terminal, between the output terminal and the ground terminal, and between the power terminal and the ground terminal. In addition, the anode and cathode of the ESD protection circuit 10 can be reversely connected to discharge a reverse electrostatic current, which can be set according to actual needs. In this embodiment, reverse connection is relative to forward connection. For example, when the forward connection is that an anode of the ESD protection circuit 10 is connected to the power terminal of the protected circuit 20 and a cathode of the ESD protection circuit 10 is connected to the ground terminal of the protected circuit 20, the reverse connection is that the anode of the ESD protection circuit 10 is connected to the ground terminal of the protected circuit 20 and the cathode of the ESD protection circuit 10 is connected to the power terminal of the protected circuit 20.

In an embodiment, the chip may include a logic chip, an analog signal or a memory chip, and so on.

In an embodiment, the chip may include a DRAM chip.

In the description of this specification, descriptions with reference to the terms "some embodiments", "other embodiments", "ideal embodiments", etc. mean that specific features, structures, materials, or characteristics described in conjunction with the embodiments or example description are included in at least one embodiment or example of the present disclosure. In this specification, the schematic representation of the forgoing terms does not necessarily refer to the same embodiment or example.

The technical features of the forgoing embodiments can be combined arbitrarily. In order to make description concise, all possible combinations of various technical features in the forgoing embodiments are not described. However, as long as there is no contradiction in combinations of these technical features, all technical features should be considered within the scope of this specification.

The forgoing embodiments only express a plurality of embodiments of this application, and the description was relatively specific and detailed, but it should not be understood as a limitation to the patent scope of the present disclosure. It should be indicated for the person skilled in the art that various modifications and improvements can be made without departing from the concept of this application, and these modifications and improvements all belong to the protection scope of this application. Therefore, the protection scope of this application should be subject to attached claims.

The invention claimed is:

1. An electrostatic discharge (ESD) protection circuit, comprising:
   an ESD protection module, arranged inside a protected chip and connected to a protected circuit; and
   a control module, connected to the ESD protection module and configured to output a low-level signal to the ESD protection module to trigger the ESD protection module to discharge an electrostatic current when an ESD event occurs in the protected chip, and output a high-level signal to the ESD protection module to reduce a static leakage current of the ESD protection module when the ESD event does not occur in the protected chip; and, wherein the ESD protection module comprises:
   a silicon controlled rectifier, having an anode, a cathode, and a trigger terminal, wherein the control module is connected between the anode and the cathode of the silicon controlled rectifier; and
   a diode string, comprising a plurality of diodes connected in series, wherein an anode of the diode string is connected to the trigger terminal of the silicon controlled rectifier, a cathode of the diode string is connected to the control module; when the ESD event occurs in the protected chip, the control module outputs a low-level signal to the cathode of the diode string to trigger the silicon controlled rectifier to discharge the electrostatic current and when the ESD event does not occur in the protected chip, the control module outputs a high-level signal to the cathode of the diode string to reduce a voltage drop across the diode string.

2. The ESD protection circuit according to claim 1, wherein a trigger voltage of the silicon controlled rectifier increases as number of diodes increases.

3. The ESD protection circuit according to claim 2, wherein the number of diodes ranges from 2 to 3.

4. The ESD protection circuit according to claim 1, wherein a holding voltage of the silicon controlled rectifier is greater than a power supply voltage of the protected chip.

5. The ESD protection circuit according to claim 1, wherein an equivalent circuit of the silicon controlled rectifier comprises a first triode, a second triode, and a first resistor, an emitter of the first triode is the anode of the silicon controlled rectifier, a base of the first triode is connected to the anode of the diode string and a collector of the second triode, a collector of the first triode is connected to a base of the second triode and one end of the first resistor, and an emitter of the second triode is connected to other end of the first resistor to serve as the cathode of the silicon controlled rectifier.

6. The ESD protection circuit according to claim 5, wherein the first triode is a PNP triode, and the second triode is an NPN triode.

7. The ESD protection circuit according to claim 1, wherein the control module comprises:
   a trigger unit, connected between the anode and the cathode of the silicon controlled rectifier, and configured to generate a low-level signal when the ESD event occurs in the protected chip, and generate a high-level signal when the ESD event does not occur in the protected chip; and
   a buffer unit, connected between the anode and the cathode of the silicon controlled rectifier, wherein an input terminal of the buffer unit is connected to an output terminal of the trigger unit, an output terminal of the buffer unit is connected to the cathode of the diode string, and the buffer unit is configured to reverse the high-level signal or the low-level signal generated by the trigger unit by even times and output the high-level signal or the low-level signal to the diode string.

8. The ESD protection circuit according to claim 7, wherein the trigger unit comprises a second resistor and a capacitor, one end of the second resistor is connected to the anode of the silicon controlled rectifier, other end of the second resistor is connected to one end of the capacitor and serves as the output terminal of the trigger unit, and other end of the capacitor is connected to the cathode of the silicon controlled rectifier.

9. The ESD protection circuit according to claim 7, wherein the buffer unit comprises a first PMOS transistor, a second PMOS transistor, a first NMOS transistor, and a second NMOS transistor, a source of the first PMOS transistor and a source of the second PMOS transistor are both connected to the anode of the silicon controlled rectifier, a source of the first NMOS transistor and a source of the second NMOS transistor are both connected to the cathode of the silicon controlled rectifier, a gate of the first PMOS transistor and a gate of the first NMOS transistor are both connected to the output terminal of the trigger unit, a drain of the first PMOS transistor and a drain of the first NMOS transistor are both connected to a gate of the second PMOS transistor and a gate of the second NMOS transistor, and a drain of the second PMOS transistor and a drain of the second NMOS transistor are both connected to the cathode of the diode string.

10. A chip, comprising a protected circuit and an electrostatic discharge (ESD) protection circuit, wherein the ESD protection circuit comprises:
    an ESD protection module, arranged inside a protected chip and connected to a protected circuit; and
    a control module, connected to the ESD protection module and configured to output a low-level signal to the ESD protection module to trigger the ESD protection module to discharge an electrostatic current when an ESD event occurs in the protected chip, and output a high-level signal to the ESD protection module to reduce a static leakage current of the ESD protection module when the ESD event does not occur in the protected chip; and, wherein the ESD protection module comprises:
    a silicon controlled rectifier, having an anode, a cathode, and a trigger terminal, wherein the control module is connected between the anode and the cathode of the silicon controlled rectifier; and
    a diode string, comprising a plurality of diodes connected in series, wherein an anode of the diode string is connected to the trigger terminal of the silicon controlled rectifier, a cathode of the diode string is connected to the control module; when the ESD event occurs in the protected chip, the control module outputs a low-level signal to the cathode of the diode string to trigger the silicon controlled rectifier to discharge the electrostatic current and when the ESD event does not occur in the protected chip, the control module outputs a high-level signal to the cathode of the diode string to reduce a voltage drop across the diode string.

11. The chip according to claim 10, wherein the protected circuit comprises a power terminal, a ground terminal, and a signal transmission terminal, and the ESD protection circuit is connected between any two of the power terminal, the ground terminal, and the signal transmission terminal to protect the protected circuit when the ESD event occurs.

12. The chip according to claim 11, wherein the chip comprises a plurality of the ESD protection circuits, the ESD protection circuit is connected between the power terminal and the ground terminal, between the power terminal and the signal transmission terminal, and between the ground terminal and the signal transmission terminal.

13. The chip according to claim 10, wherein the chip comprises a logic chip, an analog chip, or a memory chip.

14. The chip according to claim 13, wherein the chip comprises a DRAM chip.

* * * * *